United States Patent
Garben et al.

(10) Patent No.: US 11,946,653 B2
(45) Date of Patent: Apr. 2, 2024

(54) INDUCTION COOKTOP AND METHOD FOR ITS PRODUCTION

(71) Applicant: Miele & Cie. KG, Guetersloh (DE)

(72) Inventors: Meike Garben, Roedinghausen (DE);
Frank Holtmann, Hiddenhausen (DE);
Axel Heckert, Roedinghausen (DE);
Robert Bulthaup, Kirchlengern (DE)

(73) Assignee: MIELE & CIE. KG, Guetersloh (DE)

( * ) Notice: Subject to any disclaimer, the term of this patent is extended or adjusted under 35 U.S.C. 154(b) by 256 days.

(21) Appl. No.: 17/402,715

(22) Filed: Aug. 16, 2021

(65) Prior Publication Data

US 2022/0061132 A1 Feb. 24, 2022

(30) Foreign Application Priority Data

Aug. 18, 2020 (DE) ...................... 10 2020 121 629.7

(51) Int. Cl.
*F24C 7/08* (2006.01)
*F24C 15/10* (2006.01)
(Continued)

(52) U.S. Cl.
CPC ............ *F24C 7/083* (2013.01); *F24C 15/101* (2013.01); *F24C 15/102* (2013.01);
(Continued)

(58) Field of Classification Search
CPC ...... F24C 7/083; F24C 15/101; F24C 15/108; F24C 15/2021; H05B 6/1263; H05B 2206/022
(Continued)

(56) References Cited

U.S. PATENT DOCUMENTS

| | | | | |
|---|---|---|---|---|
| 5,964,072 A | * | 10/1999 | Rasmussen | E04B 1/24 52/666 |
| 6,417,496 B1 | * | 7/2002 | Bates | H05B 3/746 219/448.11 |

(Continued)

FOREIGN PATENT DOCUMENTS

| | | | | |
|---|---|---|---|---|
| DE | 202009000990 U1 | * | 4/2009 | ........... H05B 6/1245 |
| DE | 102013107089 A1 | * | 1/2015 | ............ F24C 15/101 |

(Continued)

OTHER PUBLICATIONS

DE102013107089A1 (Year: 2015).*
EP 2703726 (Year: 2014).*
DE 202009000990u1 (Year: 2009).*

*Primary Examiner* — Quang T Van
(74) *Attorney, Agent, or Firm* — LEYDIG, VOIT & MAYER, LTD.

(57) ABSTRACT

An induction cooktop includes: a cover plate with at least one cooking point; a holding plate; at least one inductive heating coil arranged between the cover plate and the holding plate; at least one electronics housing fastened to a side of the holding plate facing away from the at least one inductive heating coil and having electronics for the at least one inductive heating coil; and a lower box closing off the induction cooktop at a bottom of the induction cooktop, the lower box being open at a top thereof. The at least one electronics housing is arranged in the lower box. The holding plate covers the lower box at the top. The holding plate is connected in a force-transmitting manner to the lower box in an assembly state of the induction cooktop.

18 Claims, 6 Drawing Sheets

(51) Int. Cl.
 *F24C 15/20* (2006.01)
 *H05B 6/12* (2006.01)
 *H05K 7/20* (2006.01)

(52) U.S. Cl.
 CPC ........ *F24C 15/108* (2013.01); *F24C 15/2021* (2013.01); *H05B 6/1263* (2013.01); *H05B 2206/022* (2013.01); *H05K 7/20136* (2013.01)

(58) Field of Classification Search
 USPC ........ 219/623, 624, 622, 632, 635, 672, 677
 See application file for complete search history.

(56) References Cited

U.S. PATENT DOCUMENTS

| | | | |
|---|---|---|---|
| 9,603,202 B2* | 3/2017 | Shaw | H05B 6/1245 |
| 9,775,197 B2* | 9/2017 | Almolda Fandos | F24C 15/101 |
| 2008/0185376 A1 | 8/2008 | Gagas et al. | |
| 2022/0061132 A1* | 2/2022 | Garben | H05B 6/1263 |

FOREIGN PATENT DOCUMENTS

| | | | | |
|---|---|---|---|---|
| DE | 102013107089 A1 | 1/2015 | | |
| EP | 2703726 A1 * | 3/2014 | ............ | F24C 15/108 |

* cited by examiner

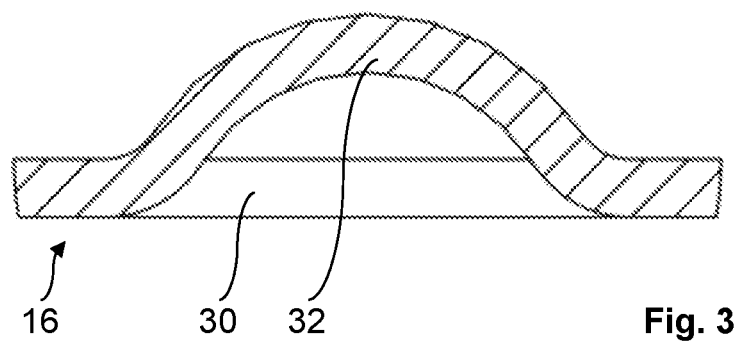
16  30  32        Fig. 3b
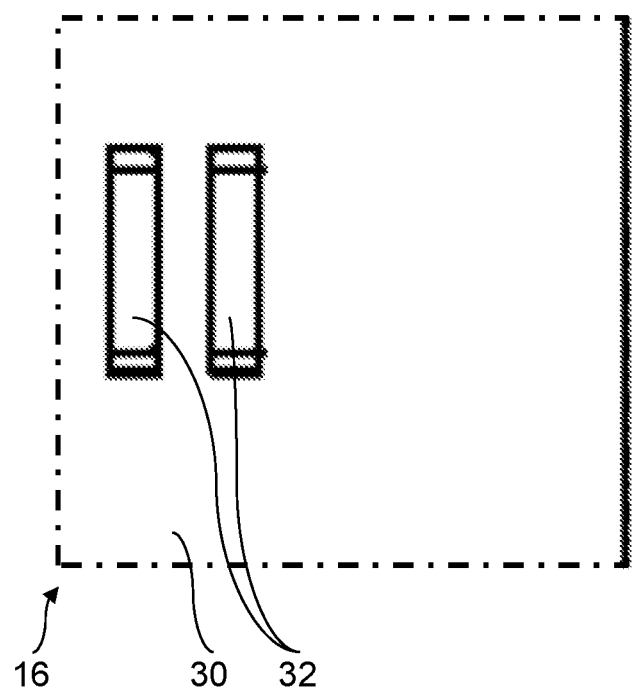
16  30  32        Fig. 3a

INDUCTION COOKTOP AND METHOD FOR ITS PRODUCTION

CROSS-REFERENCE TO PRIOR APPLICATION

Priority is claimed to German Patent Application No. DE 10 2020 121 629.7, filed on Aug. 18, 2020, the entire disclosure of which is hereby incorporated by reference herein.

FIELD

The invention relates to an induction cooktop of the type described herein and to a method for its production.

BACKGROUND

Such induction cooktops and methods for their production are already known from the prior art in a plurality of embodiments. The known induction cooktops comprise a cover plate with at least one cooking point, a holding plate, at least one inductive heating coil arranged between the cover plate and the holding plate, at least one electronics housing attached to a side of the holding plate facing away from the heating coil, with electronics for the heating coil and a lower box closing the induction cooktop downward, wherein the electronics housing with the electronics is arranged in the lower box that opens upwards and the holding plate covers the lower box upwards, and wherein the holding plate is connected to the lower box in an assembled state of the induction cooktop in a force-transmitting manner.

SUMMARY

In an embodiment, the present invention provides an induction cooktop, comprising: a cover plate with at least one cooking point; a holding plate; at least one inductive heating coil arranged between the cover plate and the holding plate; at least one electronics housing fastened to a side of the holding plate facing away from the at least one inductive heating coil and having electronics for the at least one inductive heating coil; and a lower box closing off the induction cooktop at a bottom of the induction cooktop, the lower box being open at a top thereof, wherein the at least one electronics housing is arranged in the lower box, the holding plate covers the lower box at the top, and the holding plate is connected in a force-transmitting manner to the lower box in an assembly state of the induction cooktop, wherein the lower box is configured such that, in order to transfer the induction cooktop into the assembly state, the at least one electronics housing is positionable and fixable in the lower box along an assembly axis of the induction cooktop in a first production step, and wherein, in a second manufacturing step, the holding plate is snappable onto the at least one electronics housing, which is positioned and fixed only by the lower box, essentially perpendicularly to the assembly axis of the induction cooktop.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIGS. 3a and 3b show a pair of holding tabs of the first exemplary embodiment in a plan view and in a longitudinal section through one of the holding tabs of the pair.

DETAILED DESCRIPTION

Figure 5:
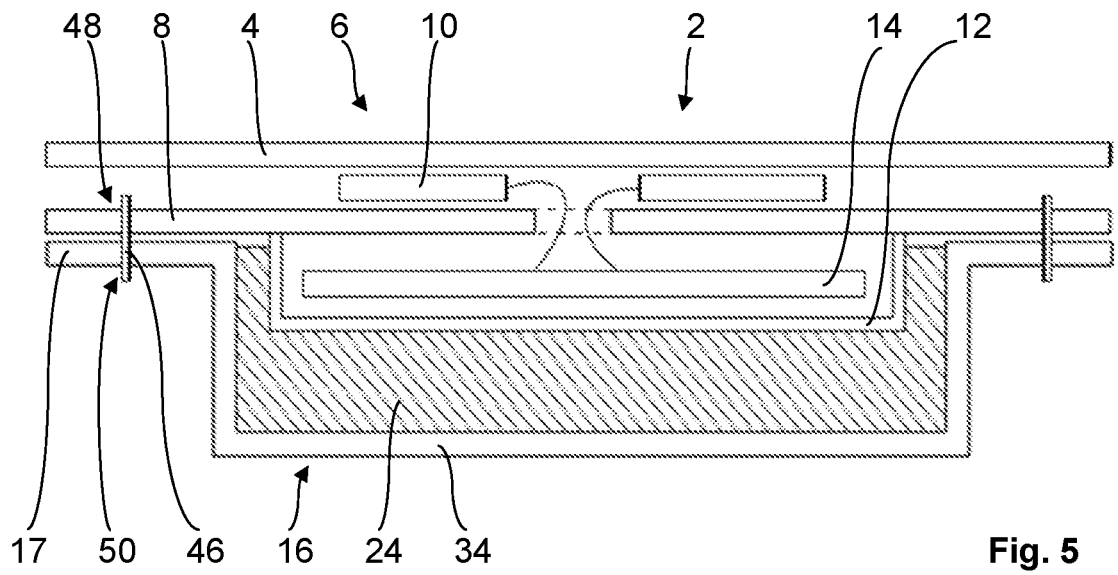
FIG. 5 shows a variant of the first exemplary embodiment, in a representation analogous to FIG. 1, and FIGS. 6a to 6e show the lower box of a second exemplary embodiment of the induction cooktop according to the invention in various views.

In an embodiment, the present invention addresses the problem of improving the production of an induction cooktop.

According to the invention, this problem is solved by an induction cooktop as described herein, which is wherein the lower box is designed in such a way that, in order to transfer the induction cooktop into its assembled state, in a first manufacturing step the electronics housing with the electronics can be positioned and fixed in the lower box along an assembly axis of the induction cooktop in such a way, in that, in a second manufacturing step, the holding plate can be snapped onto the electronics housing, which is positioned and fixed only by the lower box, essentially perpendicularly to the assembly axis of the induction cooktop. Furthermore, this problem is solved by a method for manufacturing an induction cooktop as described herein. Advantageous embodiments and developments of the invention are described herein.

The advantage achievable with the invention consists in particular in the production of an induction cooktop being improved. Due to the design according to the invention of the induction cooktop and the method for its production, the production of the induction cooktop is significantly simplified and thus can be carried out faster and more cost-effectively. Additional tools, for example the use of mounting gages or the like, and associated workstations for positioning and fixing the electronics housing relative to the lower box for the purpose of connecting the holding plate to the electronics housing are dispensable according to the invention. Instead, a simple construction of the induction cooktop along the structural axis of the induction cooktop is made possible, in which the individual components or assemblies of the induction cooktop can be built one after the other onto the lower box that opens upwards. Accordingly, individual handling of the partially heavy assemblies of the induction cooktop is also omitted, so that the production of the induction cooktop according to the invention is also ergonomically advantageous.

In principle, the induction cooktop according to the invention can be freely selected in the manner, material and dimensioning within widely suitable limits.

An advantageous development of the induction cooktop according to the invention provides that the lower box for positioning and fixing the electronics housing has a separate first retaining bar having at least one first recess and at least one separate second retaining bar having a second recess extending substantially perpendicularly to the first retaining bar, preferably that the first and/or the second retaining bar are/is designed as a holding bracket, particularly preferably that the first and the second retaining bars have notches corresponding to one another, which are designed and arranged in such a way that the first and the second retaining bars can be connected to one another in a positive-locking manner in the manner of a plug-in connection. In this way, the structure of the lower box and thus the structure and assembly of the induction cooktop according to the invention are further simplified. This applies particularly to the preferred embodiment and in particular to the particularly preferred embodiment of this development. The design of the respective retaining bar as a holding bracket ensures an improvement in the stability of the retaining bar. In addition, it is conceivable for the retaining bar designed as a holding bracket to be additionally screwed, riveted, glued or connected in a force-transmitting manner to the rest of the lower box. The preferred and particularly preferred embodiments of this development are independent of one another so that, for example, the retaining bars do not necessarily have to be designed as a retaining bracket in the particularly preferred embodiment.

Accordingly, an advantageous development of the method according to the invention provides, in order to position and fix the electronics housing in the lower box, that a separate first retaining bar of the lower box is connected to at least one first recess and at least one separate second retaining bar of the lower box extending substantially perpendicularly to the first retaining bar are connected to one another to a second recess and inserted into the rest of the lower box, preferably, that the first and second retaining bars have notches corresponding to one another, wherein the first and second retaining bars are connected to one another in a form-fitting manner by means of these notches in the manner of a plug-in connection.

An advantageous development of the aforementioned embodiment of the induction cooktop according to the invention provides that holding projections respectively corresponding to one another for positioning and fixing the first and/or the second retaining bar relative to the rest of the lower box are arranged on at least two mutually opposite side walls of the lower box, preferably, that the holding projections are formed from the respectively corresponding sidewall of the lower box, particularly preferably that the holding projections of each sidewall are formed as a pair of holding tabs spaced apart from each other. As a result, the positioning and fixing of the respective retaining bar relative to the rest of the lower box is realized in a particularly simple and robust manner in terms of design and production technology. This applies particularly to the preferred embodiment and in particular to the particularly preferred embodiment of this development.

Accordingly, an advantageous development of the latter embodiment of the method according to the invention provides that holding projections corresponding to one another are arranged on at least two opposite side walls of the lower box, wherein the first retaining bar and/or the second retaining bar are/are positioned and fixed relative to the rest of the lower box by means of these holding projections, preferably that the holding projections are formed from the respective corresponding sidewall of the lower box, particularly preferably that the holding projections of each sidewall are formed as a pair of holding tabs spaced apart from each other.

An advantageous development of the two latter embodiments of the induction cooktop according to the invention provides that the first and/or the second retaining bar is designed as a substantially airtight partition, wherein the electronics housing is designed and arranged relative to the partition wall in the assembled state of the induction cooktop, that an air stream for cooling the electronics arranged in the electronics housing can be guided through the electronics housing by means of the partition wall in such a way that the air stream can be guided from a suction side of the lower box by means of the electronics housing to a pressure side of the lower box fluidically separated from the suction side by means of the partition wall. In this way, the functionality of the first and/or second retaining bar is increased since the respective retaining bar serves not only for positioning and fixing the electronics housing relative to the lower box but can simultaneously be used as an air guide element for conducting the aforementioned air flow. Accordingly, additional air guide elements are not required, so that the number of components is reduced and the construction of the induction cooktop according to the invention is further simplified. In this context, the wording "substantially airtight" means that the electronics housing and the retaining bar designed as a partition, as well as the retaining bar designed as a partition, and the rest of the lower box, for example a bottom of the lower box, can also rest only blunt against one another. Accordingly, a sufficiently air-tight separation between the suction side and the pressure side of the lower box would be realized by means of the partition wall on the one side and thus the production costs and thus the production effort would be significantly reduced on the other side.

Accordingly, an advantageous development of the method according to the invention as described herein provides that the first and/or the second retaining bar is designed as a substantially airtight partition, wherein the electronics housing is designed in such a way and is arranged relative to the partition wall in the assembled state of the induction cooktop, that an air stream for cooling the electronics arranged in the electronics housing can be guided through the electronics housing by means of the partition wall in such a way that the air stream can be guided from a suction side of the lower box by means of the electronics housing to a pressure side of the lower box fluidically separated from the suction side by means of the partition wall.

A further advantageous development of the induction cooktop according to the invention provides that fresh air openings are formed on at least one side wall of the lower box, preferably on a side wall associated with the suction side and/or the pressure side of the lower box. A targeted supply of fresh air for cooling the electronics arranged in the electronics housing and/or discharging of cooling air heated by means of the electronics is thereby made possible.

Another advantageous development of the induction cooktop according to the invention provides that the lower box is designed as a metal part. In this way, the lower box is designed to be suitable, for example, for the requirements of the US market and the Canadian market. In principle, however, it is also conceivable for the lower box to be designed as a plastic part or from another material or a composite material.

A further advantageous development of the induction cooktop according to the invention provides that the lower box has at least one holding plate on its side facing the holding plate for fastening the holding plate to the lower box. This makes it possible to fasten the holding plate to the lower box in a particularly simple and robust manner.

The induction cooktop 2 designed as a household device comprises a cover plate 4 designed as a glass ceramic plate with a total of four cooking points 6, a holding plate 8 designed as an aluminum sheet, a total of four inductive heating coils 10 assigned to the cooking points 6 and arranged between the cover plate 4 and the holding plate 8, an electronics housing 12 fastened to a side of the holding plate 8 facing away from the heating coils 10, said electronics housing having electronics 14 for the heating coils 10 and a lower box 16 closing the induction cooktop 2 downward and designed as metal housings, wherein the electronics housing 12, which is also referred to as a generator housing, is arranged with the electronics 14 in the lower box 16 that opens upwards. In an assembly state of the induction cooktop 2 shown in FIG. 1, the holding plate 8 covers the lower box 16 at the top, the holding plate 8 being force-transmitting connected to the lower box 16 in the assembled state of the induction cooktop 2 in a manner known to those skilled in the art. The force-transmitting connection can be designed directly or indirectly and in this case comprise screw points and/or threaded pins and/or other suitable and expedient fastening techniques. For this purpose, the lower box 16 has, on its side facing the holding plate 8, a plurality of retaining flanges 17 for fastening the holding plate 8 to the lower box 16. See FIGS. 2a to 2d.

Figure 1:
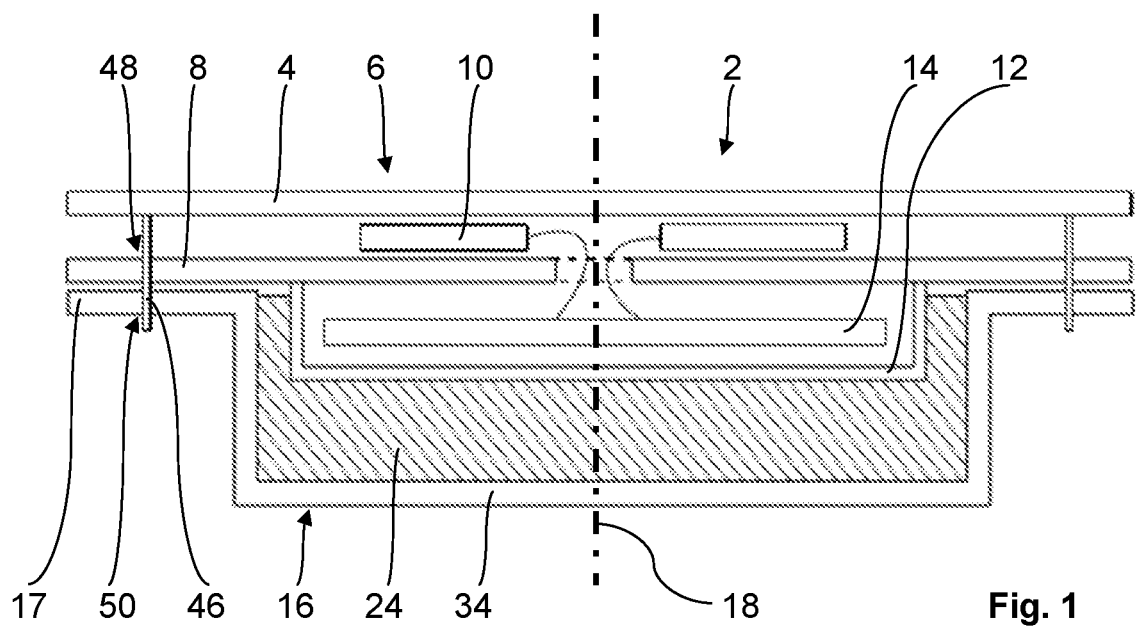
FIG. 1 shows a first exemplary embodiment of the induction cooktop according to the invention in a partial, sectional side view, with the induction cooktop in its installed state.

The lower box 16 is designed in such a way that, in order to transfer the induction cooktop 2 into its assembled state, in a first manufacturing step the electronics housing 12 with the electronics 14 can be positioned and fixed in the lower box 16 along an assembly axis of the induction cooktop 2 symbolized in FIG. 1 by a dashed line 18 in such a way that, in a second manufacturing step, the holding plate 8 can be snapped onto the electronics housing 12, which is positioned and fixed only by the lower box 16, essentially perpendicularly to the assembly axis 18 of the induction cooktop 2. For the purpose of positioning and fixing the electronics housing 12, the lower box 16 has a separate first retaining bar 20 having a first recess 22 and a separate second retaining bar 24 extending substantially perpendicularly to the first retaining bar 20 having a second recess 26, wherein the first retaining bar 20 is designed as a holding bracket. The first and second retaining bars 20, 24 have mutually corresponding latches 28 which are designed and arranged in such a way that the first and second retaining bars 20, 24 can be connected to one another in a positive-locking manner in the manner of a plug-in connection. In this regard, see FIGS. 2a to 2d.

Figure 2C:
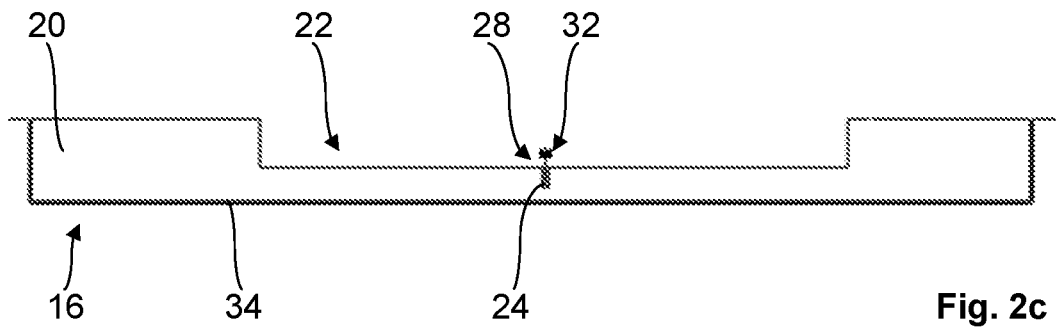
FIGS. 2a to 2d show the lower box of the first exemplary embodiment in various views.
Figure 2B:
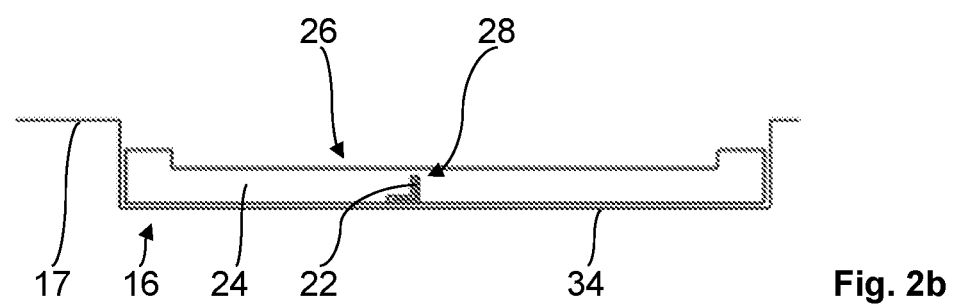
Figure 2A:
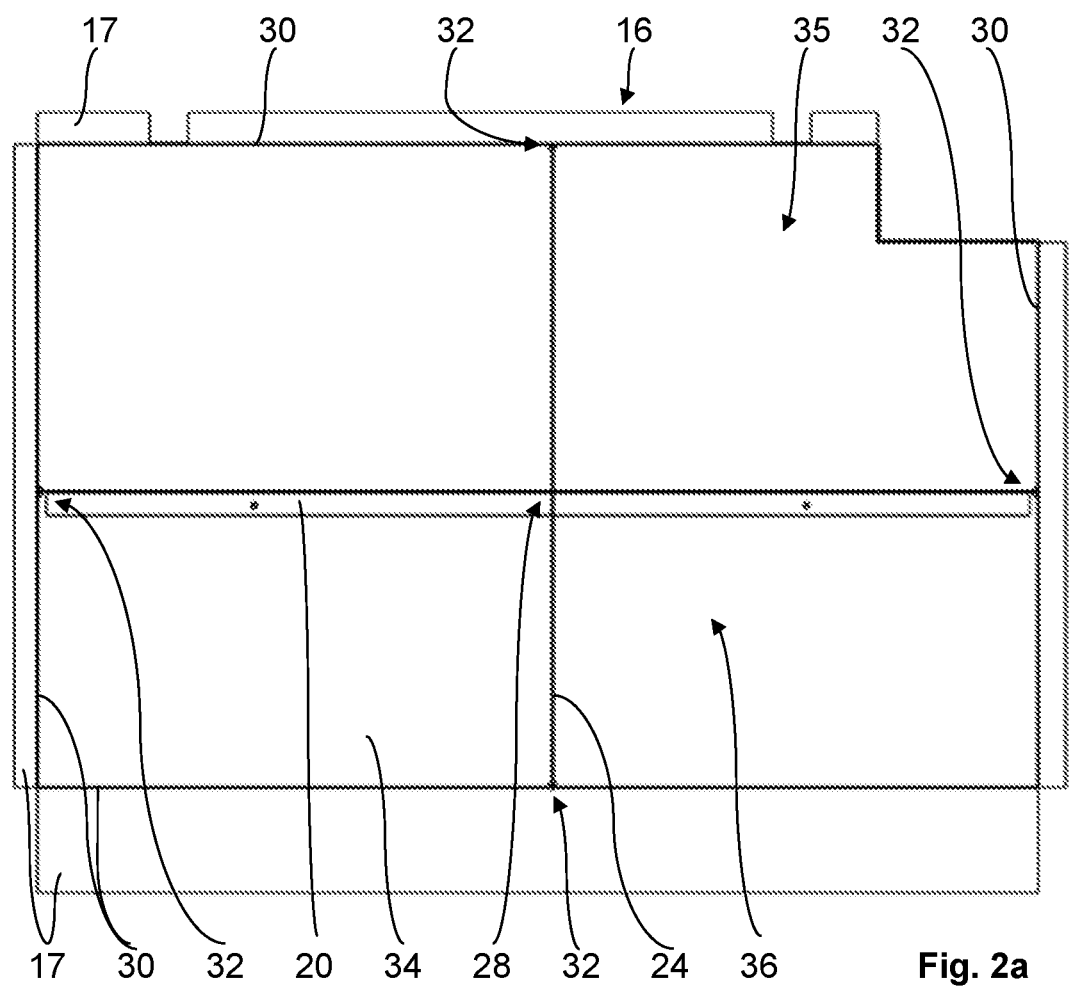

Retaining projections 32 corresponding to each other are disposed on respective opposing side walls 30 of the lower box 16 for positioning and securing the first and second retaining bars 20, 24 relative to the remainder of the lower box 16, wherein the retaining projections 32 are formed from the corresponding side wall 30 of the lower box 16, and wherein the retaining projections 32 on each side wall 30 are formed as a pair of retaining tabs. In this regard, see FIGS. 2a to 2d in conjunction with FIGS. 3a and 3b. FIG. 2a shows the lower box 16 in a top view, FIG. 2b shows the lower box 16 in a first side view, FIG. 2c shows the lower box 16 in a second side view rotated by 90° to the first side view, FIG. 2d the lower box 16 in a further top view with the electronics housing 12 inserted in the lower box 16, FIG. 3a the retaining projections 32 formed as a pair of mutually spaced retaining tabs in a top view, and FIG. 3b one of the aforementioned retaining tabs in a longitudinal section. In the present exemplary embodiment, the first retaining bar 20 designed as a holding bracket is additionally screwed, riveted, glued, glued, or connected in a force-transmitting manner to the rest of the lower box 16, namely to a bottom 34 of the lower box 16. However, this is not essential.

Figure 4:
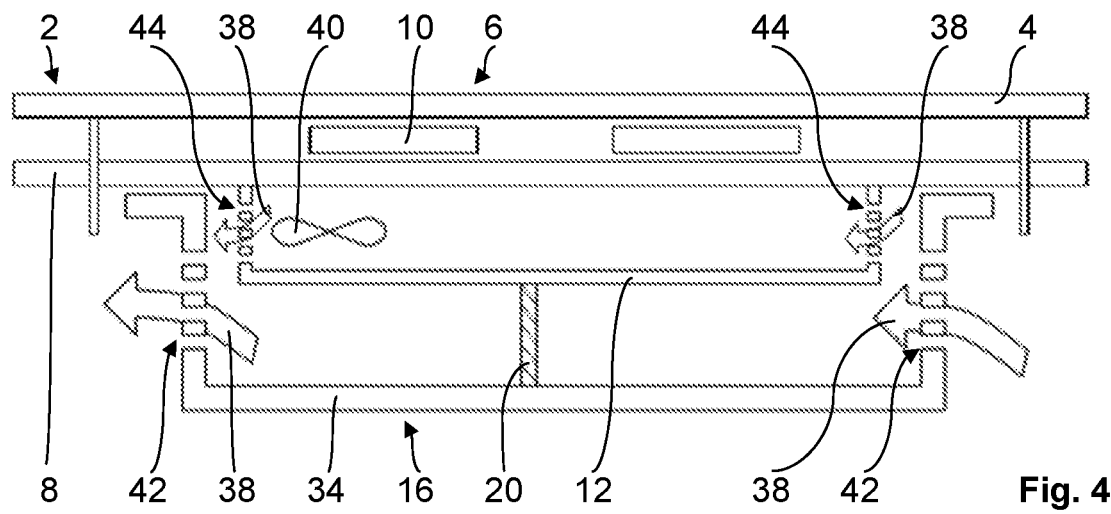
FIG. 4 shows the first exemplary embodiment in a representation analogous to FIG. 1, with flow arrows.

In the present exemplary embodiment, the first retaining bar 20 is designed as a substantially airtight partition, wherein, in the mounting state of the induction cooktop 2, the electronics housing 12 is designed in such a way and is arranged relative to the first retaining bar 20 designed as a partition, that an air stream for cooling the electronics 14 arranged in the electronics housing 12 can be conducted through the electronics housing 12 by means of the first retaining bar 20 designed as a partition wall in such a way, that the air flow can be guided from a suction side 35 of the lower box 16 by means of the electronics housing 12 to a pressure side 36 of the lower box 16, which is fluidically separated from the suction side 35 by means of the first retaining bar 20 designed as a partition wall. In this regard, see in particular FIG. 4, in which the aforementioned air stream is symbolized by arrows 38. The aforementioned air stream 38 is generated by at least one cooling fan 40 arranged in the electronics housing 12. Fresh air openings 42 are formed for the purpose of suction of fresh air and discharge of the air stream 38 heated by the cooling of the electronics 14 in the electronics housing 12 on two opposite side walls 30 of the lower box 16, namely on a side wall 30 assigned to the suction side 35 and the pressure side 36 of the lower box 16. Furthermore, the electronics housing 12 has corresponding cooling air openings 44 for the aforementioned air flow 38 and corresponding to the fresh air openings 42.

In the following, the operation of the induction cooktop according to the invention and the method according to the invention according to the first exemplary embodiment are described with reference to FIGS. 1 to 5.

For the purpose of transferring the induction cooktop 2 into its assembly state shown in FIG. 1, the lower box 16 is first clamped onto a workpiece carrier. First, the first retaining bar 20, as shown in FIGS. 2a to 2d, are inserted into the lower box 16. In this case, the first retaining bar 20 is inserted between the two retaining tabs of the retaining projections 32 arranged on the side walls 30 shown on the left and right in the image plane of FIG. 2a and is connected in a force-transmitting manner to the bottom 34 of the lower box 16, for example, by means of screws. Subsequently, the second retaining bar 24 is then inserted between each of the two retaining tabs of the retaining projections 32 arranged on the side walls 30 shown at the top and bottom in the image plane of FIG. 2a. Due to the mutually formed latches 28 of the first and second retaining bars 20, 24, the first and second retaining bars 20, 24 are connected to one another in a positive-locking manner in the manner of a plug-in connection. In this regard, see in particular FIG. 2c. The lower box 16 is now completed.

As shown in FIGS. 2b and 2c, the first and second retaining bars 20, 24 now form a receptacle for the electronics housing 12 by means of their recesses 22, 26.

Figure 2D:
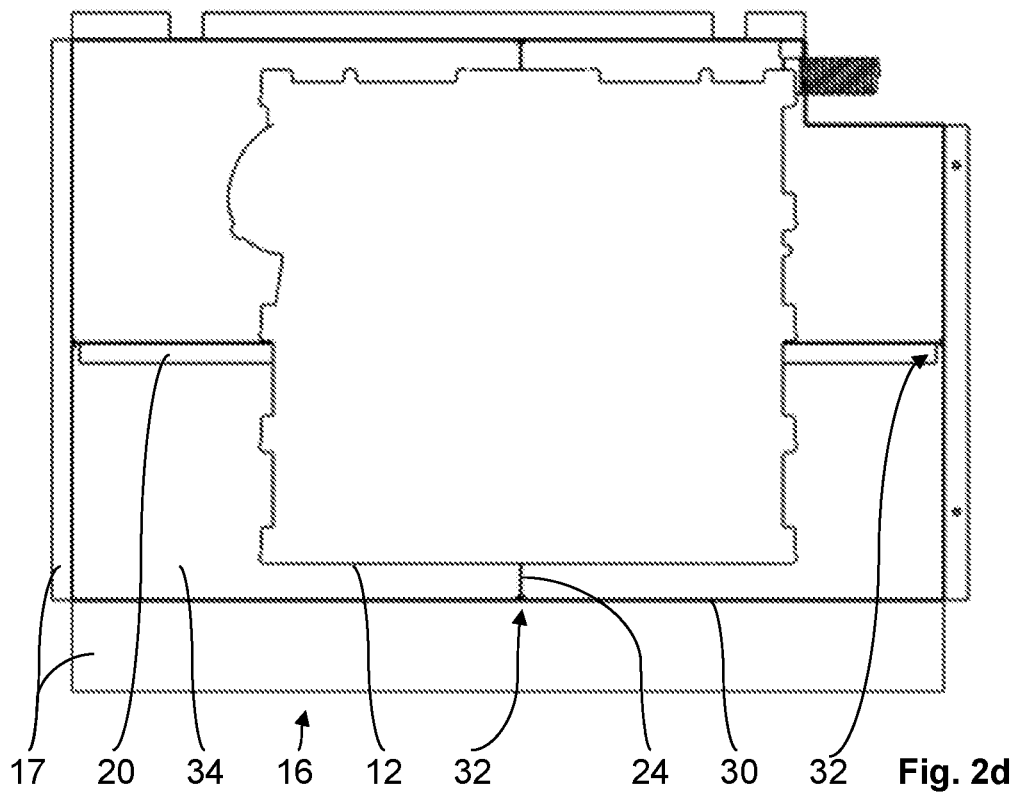

In a first manufacturing step for producing the induction cooktop 2, the electronics housing 12 is then positioned and fixed with the electronics 14 along the structural axis 18 of the induction cooktop 2 in the lower box 16 in such a way, that in a subsequent second manufacturing step, the holding plate 8 is snapped essentially perpendicularly to the structural axis 18 of the induction cooktop 2 onto the electronics housing 12 positioned and fixed only by the lower box 16. For this purpose, the holding plate 8 and the electronics housing 12 have latching means, which correspond to one another. In FIG. 2d, the lower box 16 is shown with the electronics housing 12 inserted therein. As can be clearly seen therefrom, the electronics housing 12 is positioned and fixed parallel to the image plane of FIG. 2d and positioned perpendicular to the image plane of FIG. 2d by means of the first and second retaining bars 20, 24 of the lower box 16. In the aforementioned second manufacturing step, the holding plate 8 is now parallel to the image plane in FIG. 2*d* and thus moved relative to the electronics housing 12 in such a way that the latching means corresponding to one another of the holding plate 8 and of the electronics housing 12 latch with one another. The electronics housing 12 is thus connected to the holding plate 8 in a force-transmitting manner Only the lower box 16 and the holding plate 8 are required for the aforementioned positioning and fixing of the electronics housing 12 relative to the lower box 16 and for the fastening of the electronics housing 12 to the holding plate 8. Additional components, tools and devices, such as an assembly gage, and associated workstations can be dispensed with.

In principle, it is conceivable for the holding plate 8 to be connected directly to the lower box 16 in a force-transmitting manner known to the person skilled in the art. This can be realized, for example, by means of screw connections or the like. In this regard, see FIG. 5, in which this variant of the first exemplary embodiment is shown purely by way of example.

In the first exemplary embodiment according to FIG. 1, however, it is provided that the holding plate 8 is connected indirectly to the lower box 16 in a force-transmitting manner in the manner explained below.

After the holding plate 8 has been locked to the electronics housing 12 in the manner explained above, the heating coils 10 for the total of four cooking zones 6 of the induction cooktop 2 are arranged on the holding plate 8 and fixed in a manner known to the skilled person. Finally, the cover plate 4 is mounted along the structural axis 18. In this case, threaded pins 46 arranged circumferentially on an underside of the cover plate 4 engage through fastening holes 48, 50 formed on the holding plate 8 and in the retaining flanges 17 of the lower box 16 and are screwed together with fastening nuts to an underside of the retaining flanges 17 of the lower box 16. The induction cooktop 2 is now in its assembled state as shown in FIG. 1.

As already stated above, the first retaining bar 20 is designed as a substantially airtight partition. Accordingly, in one operation of the induction cooktop 2, it is now possible to direct the above-mentioned air flow 38 for cooling the electronics 14 arranged in the electronics housing 12 through the electronics housing 12 by means of the first retaining bar 20, which is designed as a partition wall, in such a way that the air flow 38 is directed from the suction side 35 of the lower box 16 by means of the electronics housing 12 to a pressure side 36 of the lower box 16, which is fluidically separated from the suction side 35 by means of the first retaining bar 20, which is designed as a partition wall. In this regard, see FIG. 4. Further components for guiding the air stream 38 are not necessary. The phrase "substantially airtight" means here that the electronics housing 12 and the first retaining bar 20 formed as a partition, as well as the first retaining bar 20 formed as a partition and a remainder of the lower box 16, namely the bottom 34 of the lower box 16, are merely butted against each other. Accordingly, a sufficiently air-tight separation between the suction side 35 and the pressure side 36 of the lower box 16 is thus realized on one side by means of the first retaining bar 20 designed as a partition wall and thus the production costs are significantly reduced on the other side of the production effort.

Figure 6C:
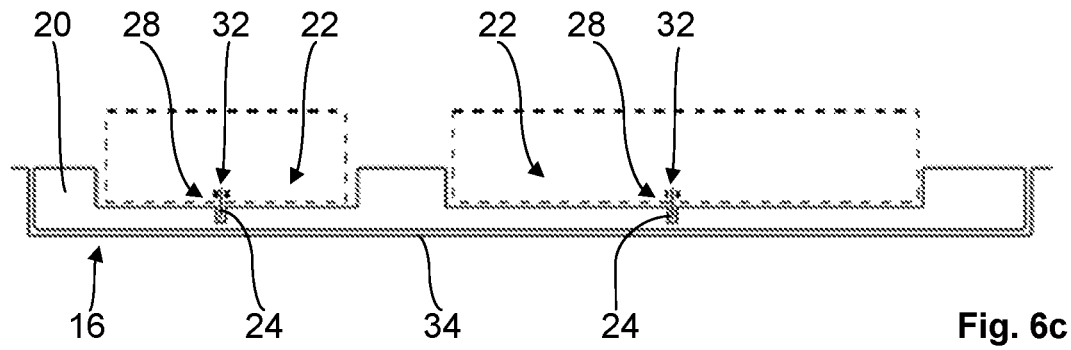
Figure 6B:
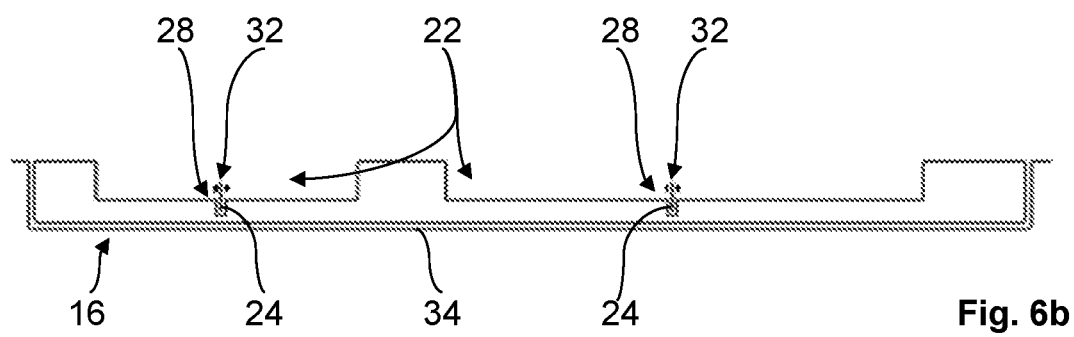
Figure 6A:
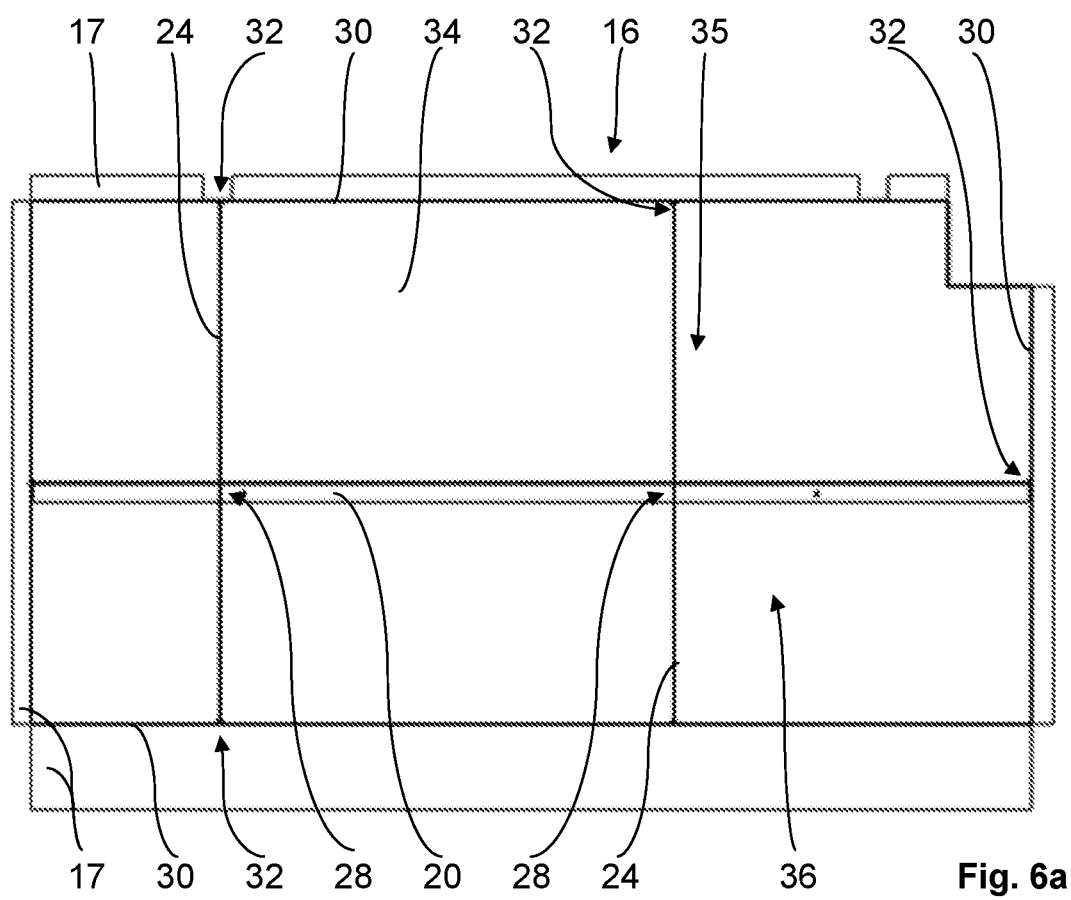
Figure 6D:
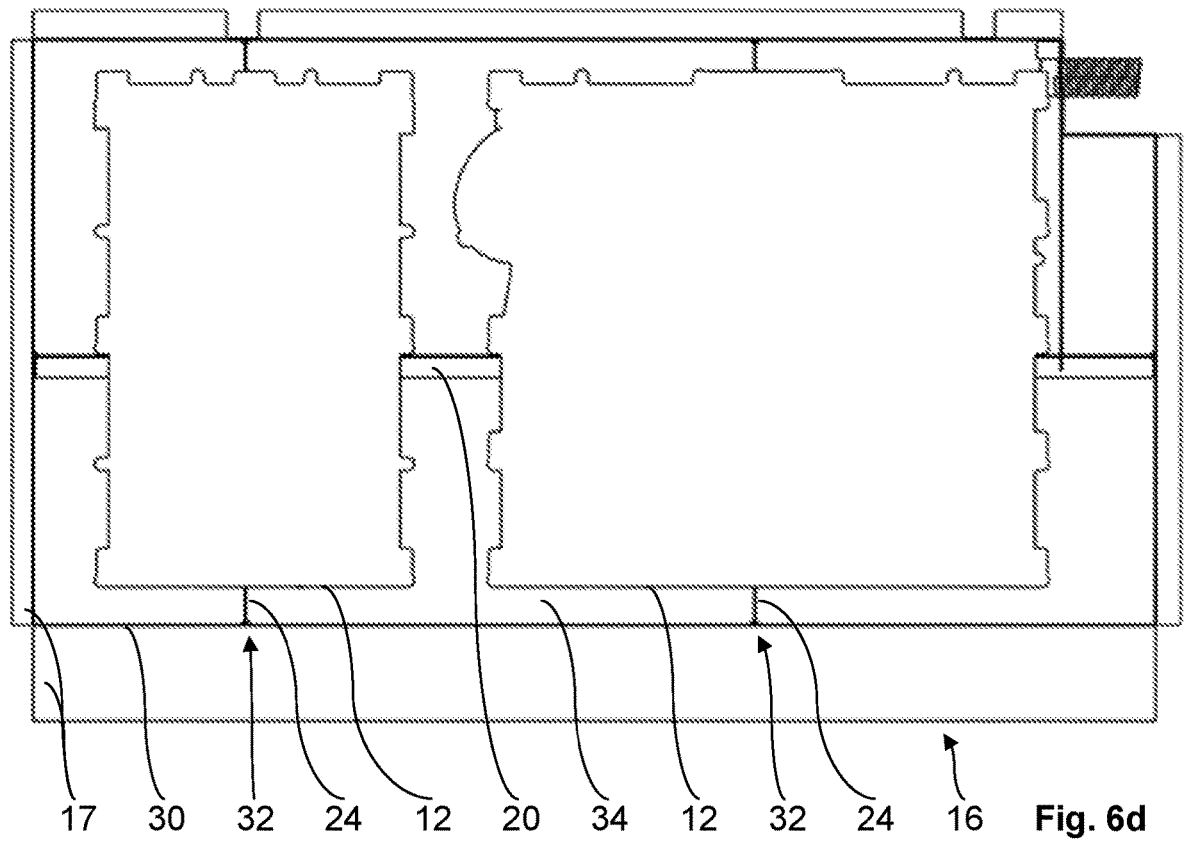
Figure 6E:
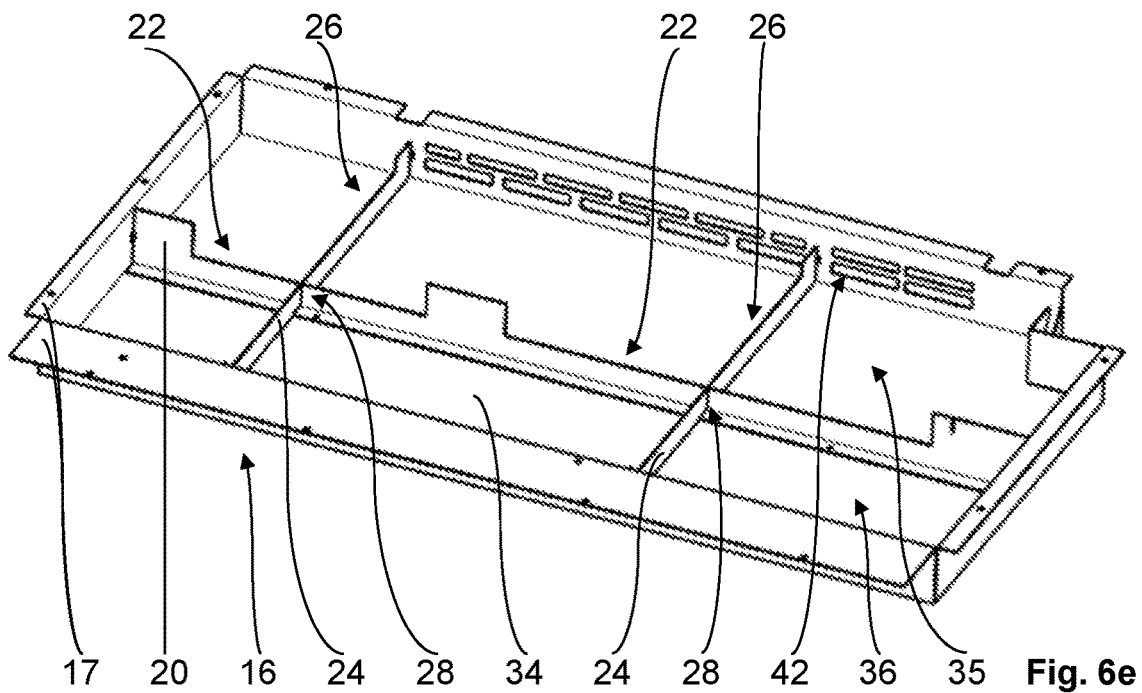

In FIGS. 6*a* to 6*e*, a second embodiment of the induction cooktop according to the invention is shown purely as an example. Here, FIG. 6*a* shows the lower box 16 in a top view, FIG. 6*b* shows the lower box 16 in a first side view, FIG. 6*c* shows the lower box 16 in a second side view comparable to the first side view, FIG. 6*d* shows the lower box 16 in another top view with electronics housings 12 inserted into the lower box 16, and FIG. 6*e* shows the lower box 16 in a perspective view. The second exemplary embodiment is explained below only within the scope of the distinguishing features regarding the first exemplary embodiment. Identical or identically acting components are provided with the same reference numbers as in the first exemplary embodiment. Otherwise, reference is made to the above explanations regarding the first exemplary embodiment.

The second exemplary embodiment substantially corresponds to the first exemplary embodiment so that, in general, reference is made to the explanations relating to the first exemplary embodiment and to FIGS. 1 to 5.

In contrast to the first exemplary embodiment, the induction cooktop 2 of the second exemplary embodiment has a total of 6 cooking points. Accordingly, the structure of the induction cooktop 2 according to the second exemplary embodiment is modified compared to that of the first exemplary embodiment. On the one hand, instead of a second retaining bar, the lower box 16 of the second exemplary embodiment has two second retaining bars 24 each having a recess 26. Secondly, the first retaining bar 20 of the second embodiment has two recesses 22 corresponding to the recesses 26 instead of one. The connection to the first retaining bar 20 and the rest of the lower box 16 corresponds to the first exemplary embodiment. In this regard, see FIGS. 6*a* to 6*d*. Due to the six instead of four cooking points 6, the induction cooktop 2 according to the second exemplary embodiment requires two electronics housings 12 with electronics 14 for controlling the heating coils 10 of the induction cooktop 2. In FIG. 6*c*, the position of the two electronics housings 12 relative to the lower box 16 with the retaining bars 20, 24 is symbolized by dashed lines. Analogous to FIG. 2*d*, FIG. 6*d* shows the lower box 16 with the electronics housings 12 inserted into the lower box 16 along the assembly axis 18. The assembly axis 18 shown in FIG. 1 is perpendicular to the image plane in FIG. 6*d*. In FIG. 6*e*, the lower box 16 with the retaining bars 20, 24 is shown in a perspective view, from which the two receptacles formed by the recesses 22, 26 of the retaining bars 20, 24 for the two electronics housings 12 are clearly visible. Analogously to the first embodiment, the first retaining bar 20 is again designed as a substantially airtight partition separating a suction side 35 from a pressure side 36 of the lower box 16, so that the air flow 38 for cooling the electronics 14 arranged in the electronics housings 12 can be conveyed from the suction side 35 of the lower box 16 via the respective electronics housing 12 to the pressure side 36 of the lower box 16, which is fluidically separated from the suction side 35 by means of the first retaining bar 20 designed as a partition. See FIG. 4.

The invention is not limited to the present exemplary embodiments. For example, the invention can also be advantageously used in commercial devices, i.e. in induction cooktops for professional use. The structural details of the aforementioned exemplary embodiments are purely exemplary, so that the induction cooktop according to the invention can also be implemented in a different manner. The same applies to the material selection for the respective components of the induction cooktop. Furthermore, the number of cooking points is not limited to four or six cooking points. Any practical number of cooking points is thus conceivable for the induction cooktop according to the invention.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An induction cooktop, comprising:
   a cover plate with at least one cooking point;
   a holding plate;
   at least one inductive heating coil arranged between the cover plate and the holding plate;
   at least one electronics housing fastened to a side of the holding plate facing away from the at least one inductive heating coil and having electronics for the at least one inductive heating coil; and
   a lower box closing off the induction cooktop at a bottom of the induction cooktop, the lower box being open at a top thereof,
   wherein the at least one electronics housing is arranged in the lower box, the holding plate covers the lower box at the top, and the holding plate is connected in a force-transmitting manner to the lower box in an assembly state of the induction cooktop,
   wherein the lower box is configured such that, in order to transfer the induction cooktop into the assembly state, the at least one electronics housing is positionable and fixable in the lower box along an assembly axis of the induction cooktop in a first production step,
   wherein, in a second manufacturing step, the holding plate is snappable onto the at least one electronics housing, which is positioned and fixed only by the lower box, perpendicularly to the assembly axis of the induction cooktop, and
   wherein the lower box has at least one retaining flange on a side facing the holding plate configured to fasten the holding plate to the lower box.

2. The induction cooktop of claim 1, wherein the lower box has a separate first retaining bar with at least one first recess and at least one separate second retaining bar running perpendicular to the first retaining bar with a second recess.

3. The induction cooktop of claim 2, wherein on at least two mutually opposite side walls of the lower box there are arranged respective mutually corresponding retaining projections configured to position and fix the first and/or the second retaining bar relative to the rest of the lower box.

4. The induction cooktop of claim 3, wherein the retaining projections are formed from the respective corresponding side wall of the lower box.

5. The induction cooktop of claim 4, wherein the retaining projections of each side wall are formed as a pair of mutually spaced retaining tabs.

6. The induction cooktop of claim 2, wherein the first and/or the second retaining bar is configured as a substantially airtight partition wall, and
   wherein the at least one electronics housing is configured and arranged relative to the partition wall in the assembled state of the induction cooktop such that an air flow for cooling the electronics arranged in the at least one electronics housing is guidable through the at least one electronics housing by the partition wall such that the air flow is guidable from a suction side of the lower box by the at least one electronics housing onto a pressure side of the lower box, which pressure side is fluidically separated from the suction side by the partition wall.

7. The induction cooktop of claim 6, wherein fresh air openings are formed on at least one side wall of the lower box.

8. The induction cooktop of claim 7, wherein the fresh air openings are formed on a side wall associated with the suction side and/or the pressure side of the lower box.

9. The induction cooktop of claim 2, wherein the first and/or the second retaining bar is/are configured as a retaining bracket.

10. The induction cooktop of claim 9, wherein the first and the second retaining bar have mutually corresponding notches which are configured such that the first and the second retaining bar are positively connectable to one another in a plug-in connection.

11. The induction cooktop of claim 1, wherein the lower box is configured as a metal part.

12. A method for producing an induction cooktop, comprising:
   providing a cover plate with at least one cooking point and a holding plate;
   arranging at least one inductive heating coil between the cover plate and the holding plate;
   fastening at least one electronics housing to a side of the holding plate facing away from the at least one inductive heating coil, the at least one electronics housing having electronics for the at least one inductive heating coil;
   providing a lower box that closes off the induction cooktop at a bottom thereof, the at least one electronics housing with the electronics being arranged in the lower box, which is open at a top thereof, and the lower box being covered at the top by the holding plate; and
   connecting the holding plate in a force-transmitting manner to the lower box when the induction cooktop is transferred to an assembly state, after which, in order to transfer the induction cooktop to the assembly state, the at least one electronics housing with the electronics is positioned and fixed in the lower box along an assembly axis of the induction cooktop in a first manufacturing step such that, in a second manufacturing step, the holding plate is snapped onto the at least one electronics housing, which is positioned and fixed only by the lower box, perpendicularly to the assembly axis of the induction cooktop, wherein the lower box has at least one retaining flange on a side facing the holding plate configured to fasten the holding plate to the lower box.

13. The method of claim 12, wherein, for positioning and fixing the at least one electronics housing in the lower box, a separate first retaining bar of the lower box having at least one first recess and at least one separate second retaining bar of the lower box extending perpendicular to the first retaining bar and having a second recess are connected to one another and inserted into a remainder of the lower box.

14. The method of claim 13, wherein retaining projections corresponding to one another are arranged in each case on at least two mutually opposite side walls of the lower box, the first retaining bar and/or the second retaining bar being positioned and fixed relative to the remainder of the lower box by the retaining projections.

15. The method of claim 14, wherein the retaining projections are formed from a respective corresponding side wall of the lower box.

16. The method of claim 15, wherein the retaining projections of each side wall are formed as a pair of mutually spaced retaining tabs.

17. The method of claim 13, wherein the first and/or the second retaining bar is formed as a substantially airtight partition, and wherein the at least one electronics housing is formed in such a way and arranged relative to the partition in the assembled state of the induction cooktop, that an air flow for cooling the electronics arranged in the at least one electronics housing is guidable through the at least one electronics housing by the partition wall such that the air flow is guidable from a suction side of the lower box by the at least one electronics housing onto a pressure side of the lower box, which pressure side is fluidically separated from the suction side by the partition wall.

18. The method of claim 13, wherein the first and the second retaining bar have notches corresponding to one another, the first and the second retaining bar being positively connected to one another by the notches in a plug-in connection.

* * * * *